US012093491B2

United States Patent
Sasaki et al.

(10) Patent No.: US 12,093,491 B2
(45) Date of Patent: Sep. 17, 2024

(54) OPERATION DETECTION DEVICE

(71) Applicant: ALPS ALPINE CO., LTD., Tokyo (JP)

(72) Inventors: Tomoya Sasaki, Miyagi (JP); Shotaro Asakura, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 0 days.

(21) Appl. No.: 18/461,800

(22) Filed: Sep. 6, 2023

(65) Prior Publication Data
US 2023/0418420 A1      Dec. 28, 2023

Related U.S. Application Data

(63) Continuation of application No. PCT/JP2022/007784, filed on Feb. 25, 2022.

(30) Foreign Application Priority Data

Apr. 1, 2021    (JP) ................................. 2021-063104

(51) Int. Cl.
*G06F 3/041*    (2006.01)
*G06F 3/044*    (2006.01)

(52) U.S. Cl.
CPC .................................. *G06F 3/044* (2013.01)

(58) Field of Classification Search
CPC .......... G06F 3/041; G06F 3/044; G06F 3/046; H03K 17/955; H03K 17/96
See application file for complete search history.

(56) References Cited

U.S. PATENT DOCUMENTS 8,933,351 B2 *   1/2015   Noguchi .............. G09G 3/3674
                                                    345/173
11,068,107 B2 *  7/2021   Kubo ..................... G06F 3/0412
(Continued)

FOREIGN PATENT DOCUMENTS

JP   2020-154836   9/2020
WO   2020/158524   8/2020

OTHER PUBLICATIONS

International Search Report for PCT/JP2022/007784 mailed on May 10, 2022.

*Primary Examiner* — Joe H Cheng
(74) *Attorney, Agent, or Firm* — IPUSA, PLLC

(57) ABSTRACT

Operation detection device having high detection accuracy based on reduced effects of noise is provided. Operation detection device includes electrostatic sensor, drive circuit to output a drive signal to electrostatic sensor to detect operator's operation on electrostatic sensor, and control unit to determine presence or absence of operation based on output value of electrostatic sensor, and to control drive waveform of drive signal. Control unit controls drive waveform according to a cycle that is a predetermined period of time including both detection period in which detection of operation is performed and non-detection period in which detection of operation is not performed. The drive waveform has a shape that is based on periodic function that repeats a constant pattern for an entirety of the cycle. The control unit changes the phase of the drive signal in the detection period by controlling a property of the drive waveform in the non-detection period.

7 Claims, 14 Drawing Sheets

(56) References Cited

U.S. PATENT DOCUMENTS

| | | | |
|---|---|---|---|
| 2010/0321305 A1* | 12/2010 | Chang | G06F 3/0445 345/173 |
| 2013/0082977 A1* | 4/2013 | Noguchi | G06F 3/0445 345/174 |
| 2013/0194225 A1 | 8/2013 | Shen et al. | |
| 2014/0152617 A1* | 6/2014 | Kida | G06F 3/04166 345/174 |
| 2015/0116267 A1* | 4/2015 | Inoue | G06F 3/04182 345/174 |
| 2015/0205433 A1* | 7/2015 | Mizuhashi | G06F 3/04184 345/174 |
| 2015/0277657 A1* | 10/2015 | Azumi | G11C 19/28 345/174 |
| 2016/0098124 A1* | 4/2016 | Takeda | G06F 3/0446 345/174 |
| 2016/0202820 A1* | 7/2016 | Ito | G06F 3/0412 345/173 |
| 2018/0052558 A1 | 2/2018 | Wang et al. | |
| 2021/0342055 A1 | 11/2021 | Hirai | |
| 2023/0418420 A1* | 12/2023 | Sasaki | G06F 3/044 |

* cited by examiner

FIG.13
(A)
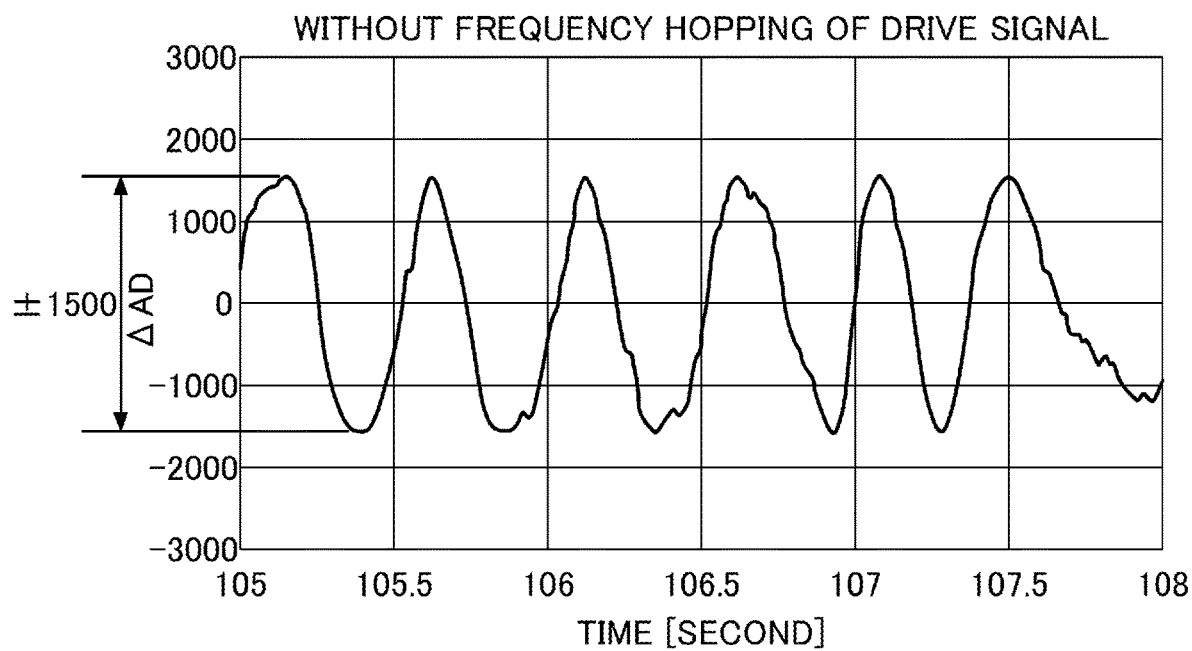
(B)
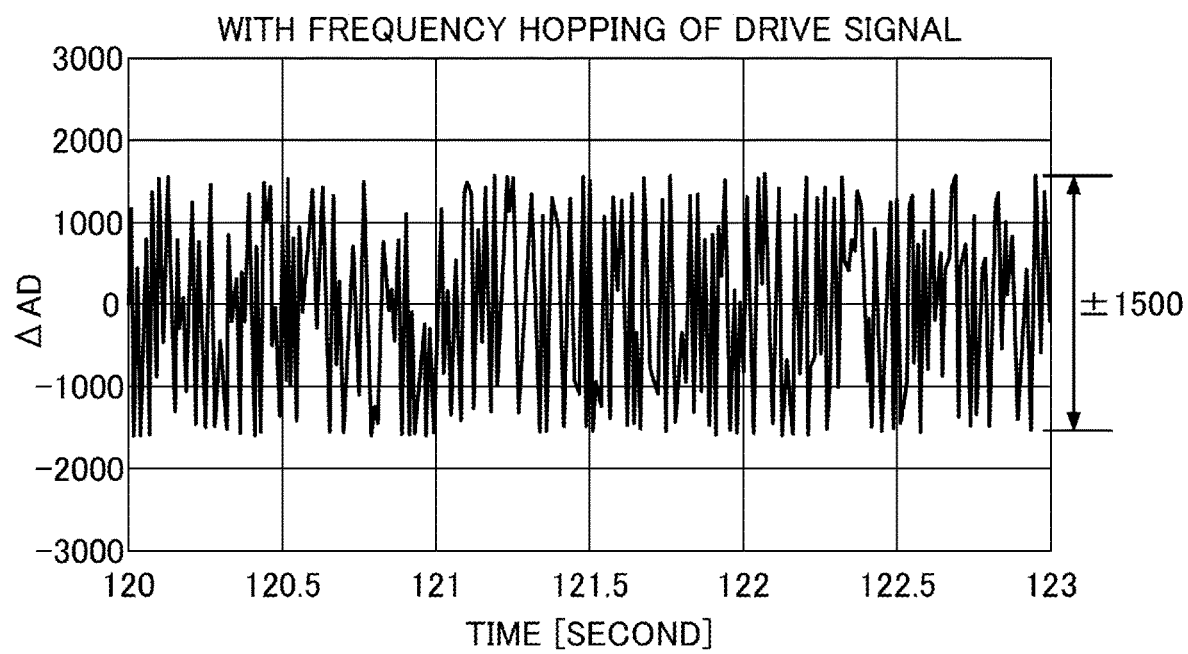

OPERATION DETECTION DEVICE

CROSS-REFERENCE TO RELATED APPLICATIONS

This application is a continuation application of International Application No. PCT/JP2022/007784, filed on Feb. 25, 2022, and designating the U.S., which is based upon and claims priority to Japanese Patent Application No. 2021-063104, filed on Apr. 1, 2021, the entire contents of which are incorporated herein by reference.

BACKGROUND

Technical Field

The present invention relates to an operation detection device.

Description of Related Art

A display device including a plurality of gate lines and a plurality of common electrodes used for both of image display and touch detection has been hitherto controlled by an existing control device including: a first acquiring unit configured to acquire a specific frequency that should be avoided; a second acquiring unit configured to acquire a drive frequency for a gate signal supplied to the plurality of gate lines; and a changing unit configured to change the drive frequency in a case where the specific frequency and the drive frequency that are acquired satisfy a change condition (for example, see International Publication No. 2020-158524).

SUMMARY

Here, there is no description about in what period the existing control device changes the drive frequency. When it changes the drive frequency in a period in which, like touch detection, presence or absence of an operation is detected based on capacitance, the detection accuracy may decrease due to a change in a property of the detection circuit.

A device configured to detect presence or absence of an operation based on capacitance needs to reduce effects of a noise having a frequency that is relatively close to the drive frequency and should be avoided, when such a noise occurs and in order for the detection device itself to realize sensing of the frequency that should be avoided, like it determines presence or absence of an operation. However, when a detected value based on a noise and a detected value based on a touch are similar to each other, the detection device may erroneously determine that a touch has been performed, for a noise it has picked up.

Hence, it is an object to provide an operation detection device having a high detection accuracy based on reduced effects of a noise.

An operation detection device according to an embodiment of the present invention includes: an electrostatic sensor; a drive circuit configured to output a drive signal to the electrostatic sensor in order to detect an operator's operation on the electrostatic sensor; and a control unit configured to determine presence or absence of the operation based on an output value of the electrostatic sensor, and control a drive waveform of the drive signal, wherein the control unit controls the drive waveform according to a cycle that is a predetermined period of time including both a detection period in which detection of the operation is performed and a non-detection period in which detection of the operation is not performed, the drive waveform has a shape that is based on a periodic function that repeats a constant pattern for an entirety of the cycle, and the control unit changes a phase of the drive signal in the detection period by controlling a property of the drive waveform in the non-detection period.

It is possible to provide an operation detection device having a high detection accuracy based on reduced effects of a noise.

BRIEF DESCRIPTION OF THE DRAWINGS

FIG. 13 is a drawing illustrating an example of an effect resulting from randomly changing a phase difference between a drive signal and a noise by frequency hopping.

DETAILED DESCRIPTION

Embodiments to which an operation detection device according to the present invention is applied will be described below.

Embodiments

Figure 1:
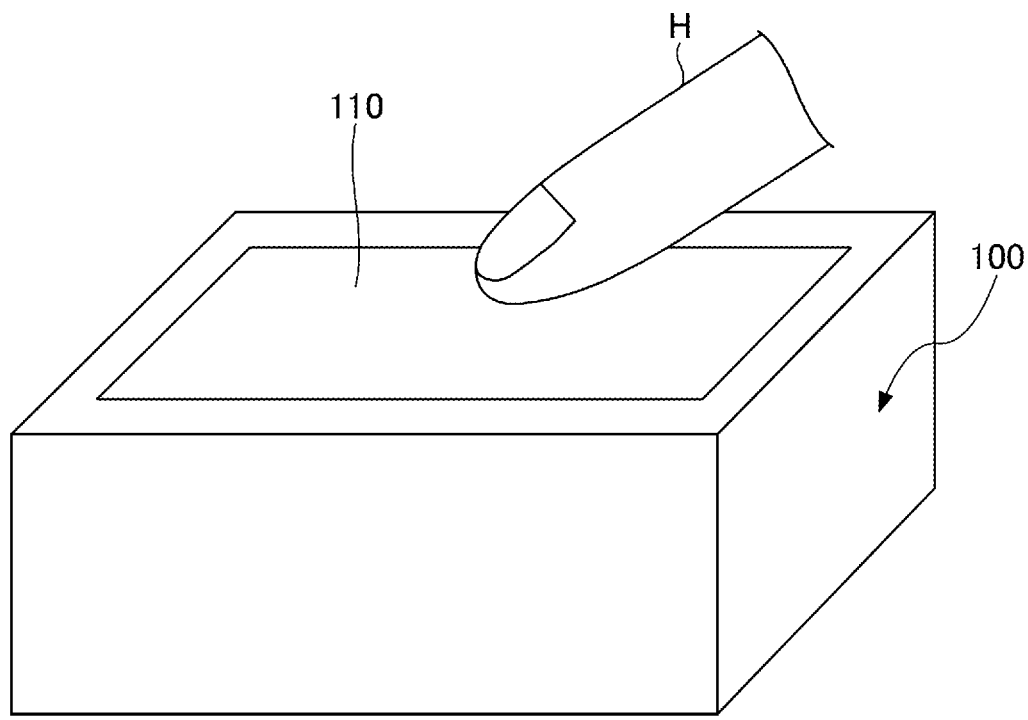
FIG. 1 is a drawing illustrating an example of an operation detection device 100 according to an embodiment.

FIG. 1 is a drawing illustrating an example of an operation detection device 100 according to an embodiment. As illustrated in FIG. 1, for example, the operation detection device 100 is mounted on a vehicle, and is internally equipped with an electrostatic sensor 110. For example, the operation detection device 100 is configured to detect whether a hand H of a driver is touching the electrostatic sensor 110 or not. Determining whether the hand H of the driver is touching the electrostatic sensor 110 or not means determining presence or absence of an operation on the operation detection device 100 by the driver.

In the following description, for generalization, a driver of a vehicle is referred to as an operator of the operation detection device 100. The operation detection device 100 is not limited to uses in which it is embedded in a vehicle. In the following description, an operation detection device 100 that can determine whether an operator is touching an object equipped with the electrostatic sensor 110 or not will be described. An operator's touching the object equipped with the electrostatic sensor 110 will be described as an operator's operation.

Figure 2:
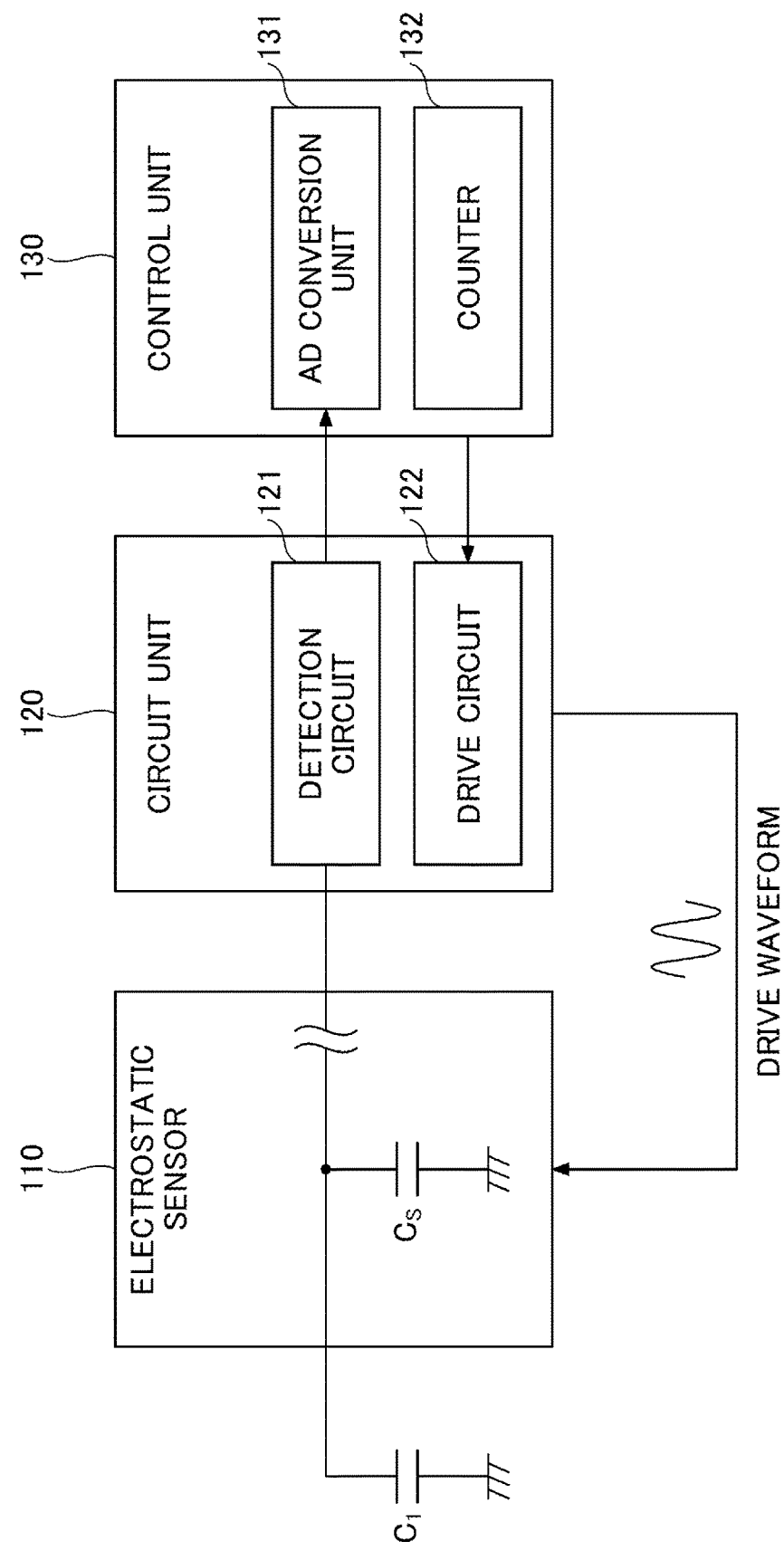
FIG. 2 is a drawing illustrating an example of a configuration of the operation detection device 100.

FIG. 2 is a drawing illustrating an example of the configuration of the operation detection device 100. The operation detection device 100 includes the electrostatic sensor 110, a circuit unit 120, and a control unit 130.

The electrostatic sensor 110 includes a capacitor Cs between a sensor electrode and a GND potential. In FIG. 2, a capacitor C1 equivalent to the hand H is connected to the electrostatic sensor 110 for illustrating a state in which an operator is performing an operation by the hand H. The electrostatic sensor 110 is connected to a detection circuit 121 of the circuit unit 120.

The circuit unit 120 includes the detection circuit 121 and a drive circuit 122. The detection circuit 121 is configured to detect the capacitance of the electrostatic sensor 110, filter or amplify the capacitance, and output the result to the control unit 130. The drive circuit 122 is configured to output to the electrostatic sensor 110, a drive waveform having a shape that is based on a periodic function that repeats a constant pattern for the entirety of a cycle of, for example, a sinusoidal wave or a square wave in a segment having the cycle, which continues for a predetermined period of time. For example, the drive circuit 122 outputs an alternating-current waveform having a sinusoidal wave shape, and the detection circuit 121 filters or amplifies an electric signal obtained through the electrostatic sensor 110.

The control unit 130 is realized by, for example, a microcomputer. The microcomputer is realized by a computer including, for example, a central Processing Unit (CPU), a Random Access Memory (RAM), a Read Only Memory (ROM), an input/output interface, and an internal bus.

The control unit 130 includes an Analog-to-Digital (AD) conversion unit 131 and a counter 132. The AD conversion unit 131 and the counter 132 are representations of functions of programs executed by the control unit 130 in the form of functional blocks.

The AD conversion unit 131 is configured to convert an output from the detection circuit 121 to a digital value. An output from the AD conversion unit 131 is a detected value representing the capacitance detected from the electrostatic sensor 110. The counter 132 is configured to count how much (ΔAD) an output from the AD conversion unit 131 changes and output the count as a detected value change ΔAD. The circuit unit 120 and the control unit 130 are realized by, for example, an Integrated Circuit (IC) chip.

Figure 3:
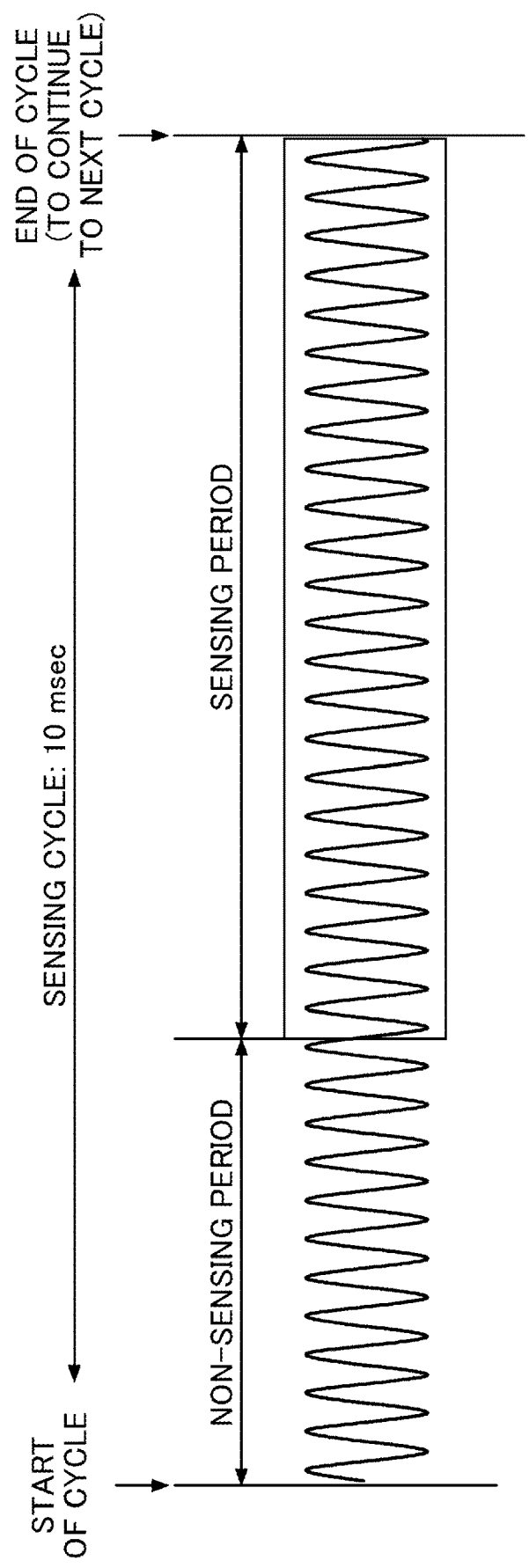
FIG. 3 is a drawing illustrating an example of a sensing cycle.

FIG. 3 is a drawing illustrating an example of a sensing cycle. The sensing cycle is a cycle according to which the operation detection device 100 detects the capacitance of the electrostatic sensor 110, and is constituted by a non-sensing period and a sensing period. The non-sensing period is an example of a non-detection period, and the sensing period is an example of a detection period. The period of time for which one sensing cycle continues is an example of a predetermined period of time including a detection period and a non-detection period. The non-sensing period is a period in which, for example, a detected value detected in the sensing period is processed.

For example, one sensing cycle is 10 milliseconds (msec). The non-sensing period is a predetermined period from the start of the cycle, and the sensing period is a remaining period after the non-sensing period ends. The operation detection device 100 performs detection of the capacitance of the electrostatic sensor 110 during the sensing period, and does not perform detection of the capacitance during the non-sensing period.

Figure 4:
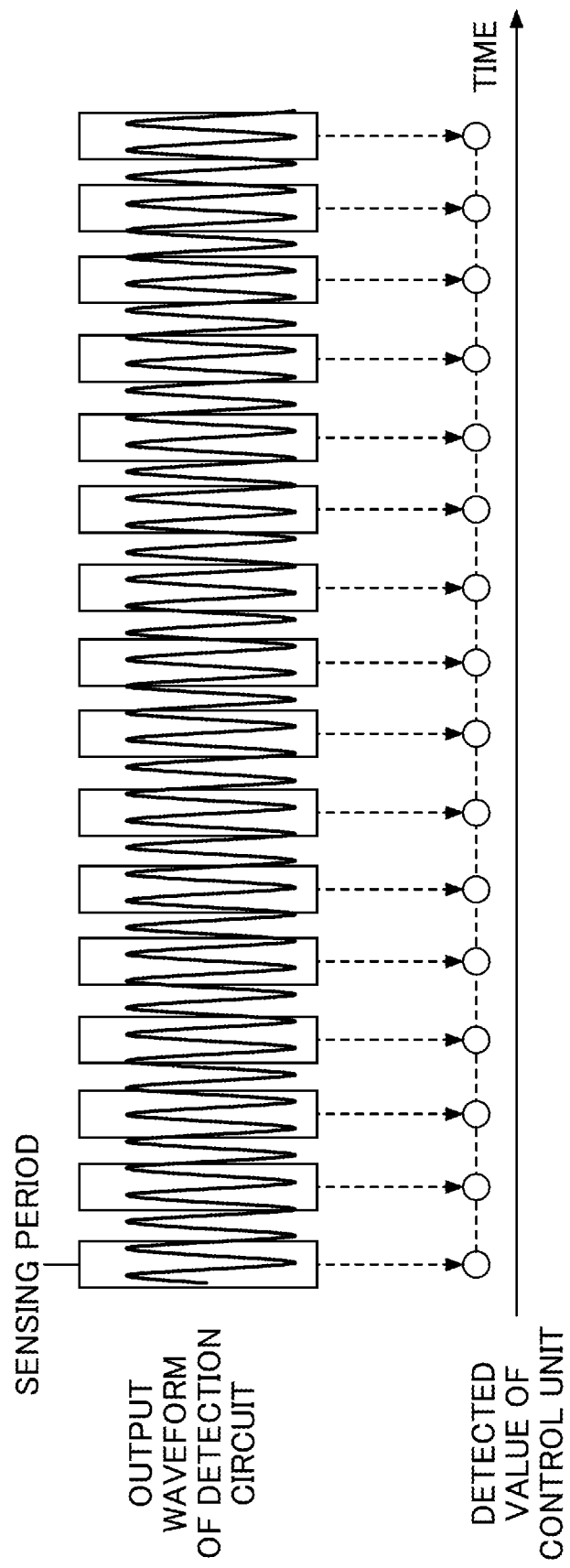
FIG. 4 is a drawing illustrating an example of output waveforms of a detection circuit 121 and detected values of a control unit 130 in sensing periods.

FIG. 4 is a drawing illustrating an example of output waveforms of the detection circuit 121 and detected values of the control unit 130 in sensing periods. The output waveforms and the detected values illustrated in FIG. 4 are those in a state in which an operator is not performing an operation (i.e., a state in which the operation detection device 100 is detecting, for example, no hand H of the operator, and in which no noise is occurring.

As illustrated in FIG. 4, in a plurality of successive sensing periods, the output waveform of the detection circuit 121 remains the same, and the detected value generated by the control unit 130 by AD conversion is constant. When no noise is occurring, a constant detected value is obtained like this. Once the operator performs an operation, the output waveform from the electrostatic IC 120 changes, and the detected value also changes.

Figure 5:
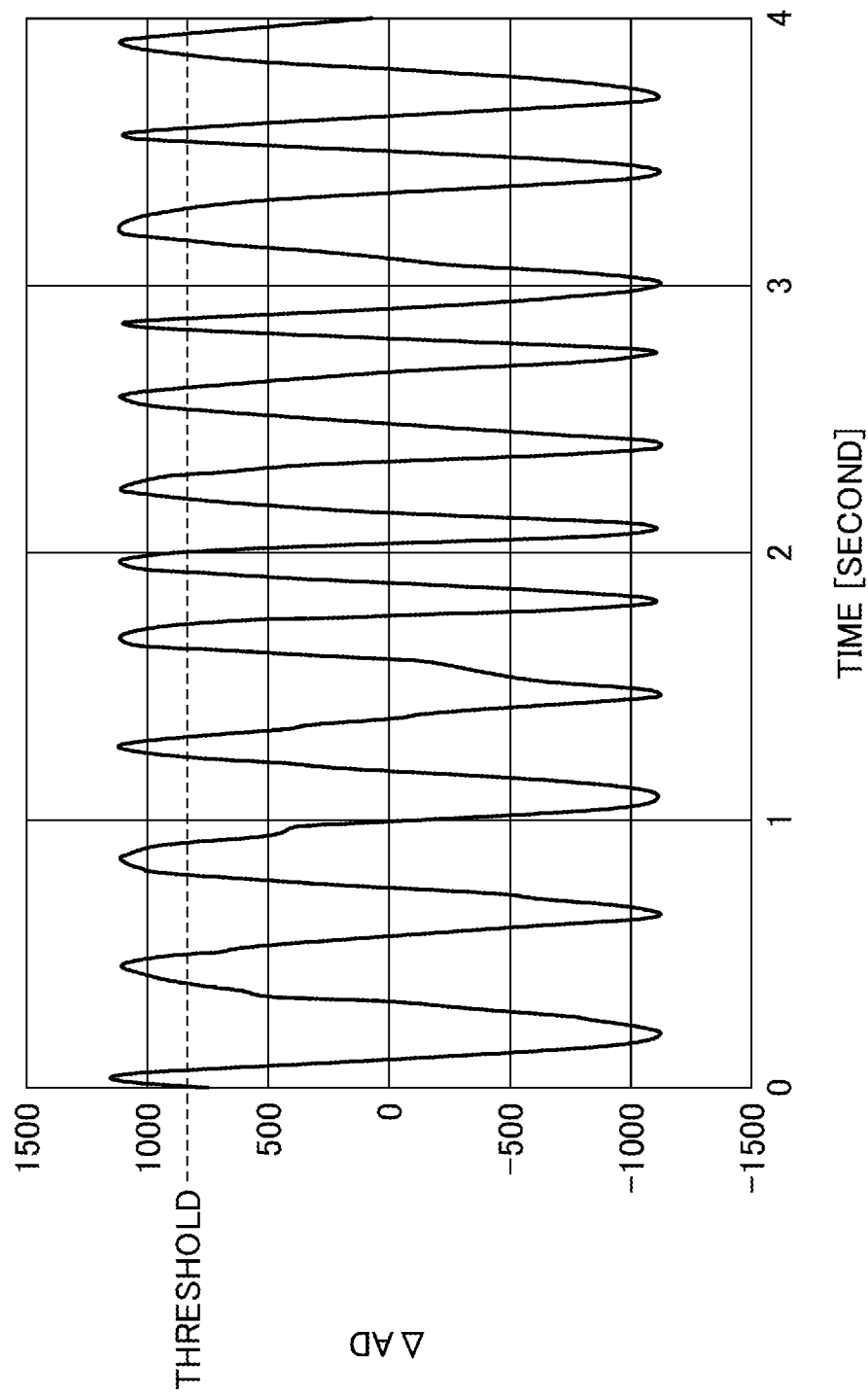
FIG. 5 is a drawing illustrating an example of a temporal detected value change ΔAD in a state in which an operator is not performing an operation and a noise is occurring.

FIG. 5 is a drawing illustrating an example of temporal change, i.e., a detected value change ΔAD in a state in which the operator is not performing an operation and a noise is occurring. FIG. 5 represents time (second) on the horizontal axis, and illustrates a property for, for example, 4 seconds. A threshold, which the control unit 130 uses to determine presence or absence of an operation, is indicated on the vertical axis representing the change ΔAD. When the change ΔAD becomes equal to or higher than the threshold, it is determined that an operation is being performed. The property illustrated in FIG. 5 will be described as a property obtained from a comparative operation detection device, not the operation detection device 100. The comparative operation detection device includes an electrostatic sensor 110 and a circuit unit 120 as does the operation detection device 100.

Here, there is a noise source near the comparative operation detection device, and the drive frequency of the drive signal from the drive circuit 122 and the frequency of a noise are so extremely close that detection of capacitance from the electrostatic sensor 110 and by the detection circuit 121 are affected.

In a case where a noise is occurring even when the operator is not performing an operation, the noise is picked up by the electrostatic sensor 110 and a change occurs as the detected value change ΔAD. In a state in which the operator is not performing an operation and no noise is occurring, the detected value change ΔAD is zero. When the frequency of a noise and the drive frequency of the drive signal are close, changes occur as the detected value change ΔAD very slowly at a pace of approximately from twice through three times per second as illustrated in FIG. 5. When changes occur approximately from twice through three times per second as described, the property becomes similar to one that occurs when the operator performs an operation in a state in which no noise is occurring. Hence, it may be erroneously detected that an operation has been performed.

Figure 6:
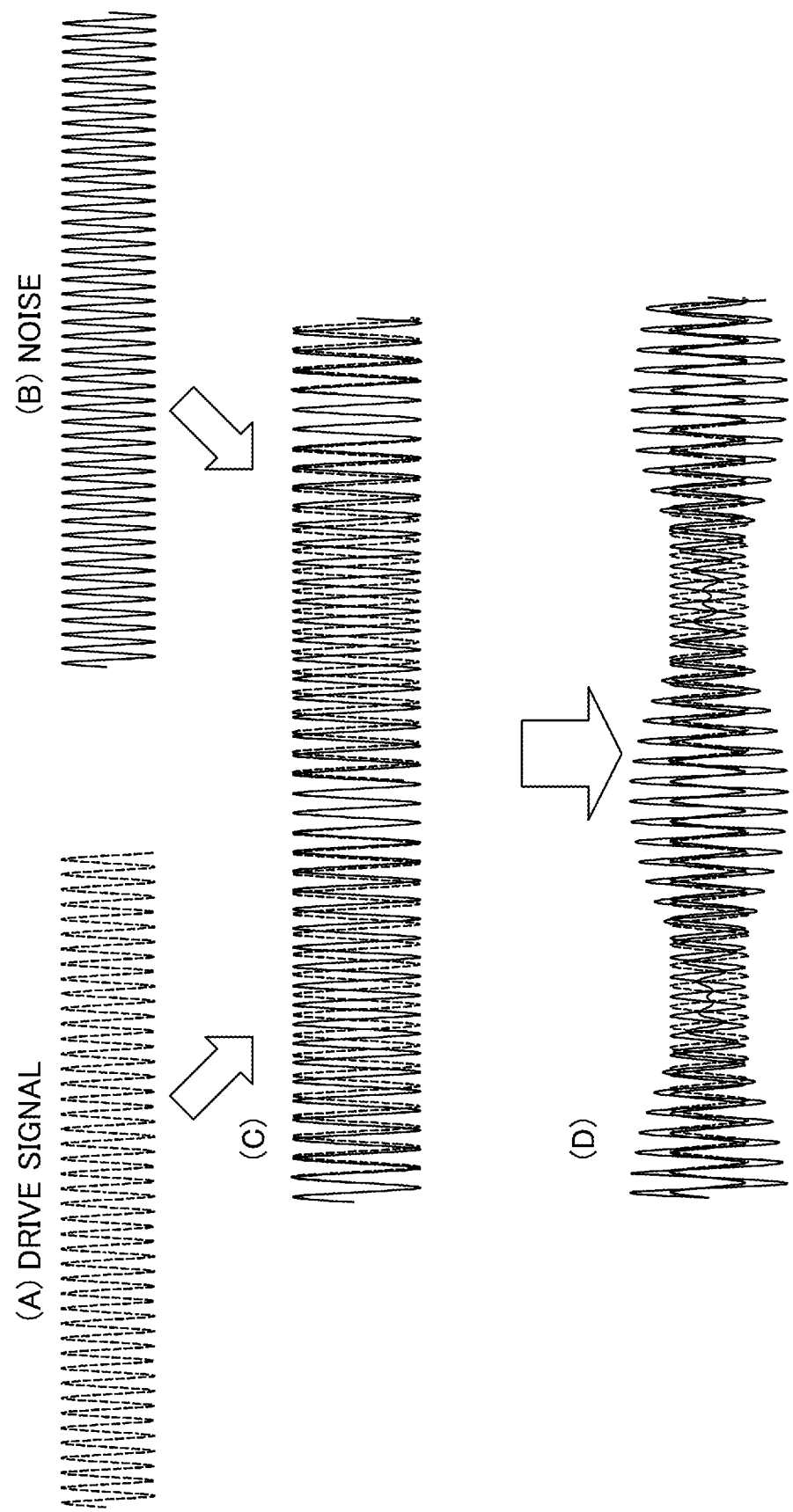
FIG. 6 is a drawing illustrating an example of a synthesized wave obtained by superimposing a drive signal for an electrostatic sensor and a noise having a frequency close to the frequency of the drive signal.

FIG. 6 is a drawing illustrating a synthesized wave obtained by superimposing the drive signal and a noise.

When the drive signal illustrated in (A) of FIG. 6 and the noise illustrated in (B) of FIG. 6 are displayed while being superimposed, the result is as illustrated in (C) of FIG. 6. The synthesized wave has a waveform that is as if subjected to Amplitude Modulation (AM) as illustrated in (D) of FIG. 6.

Figure 7:
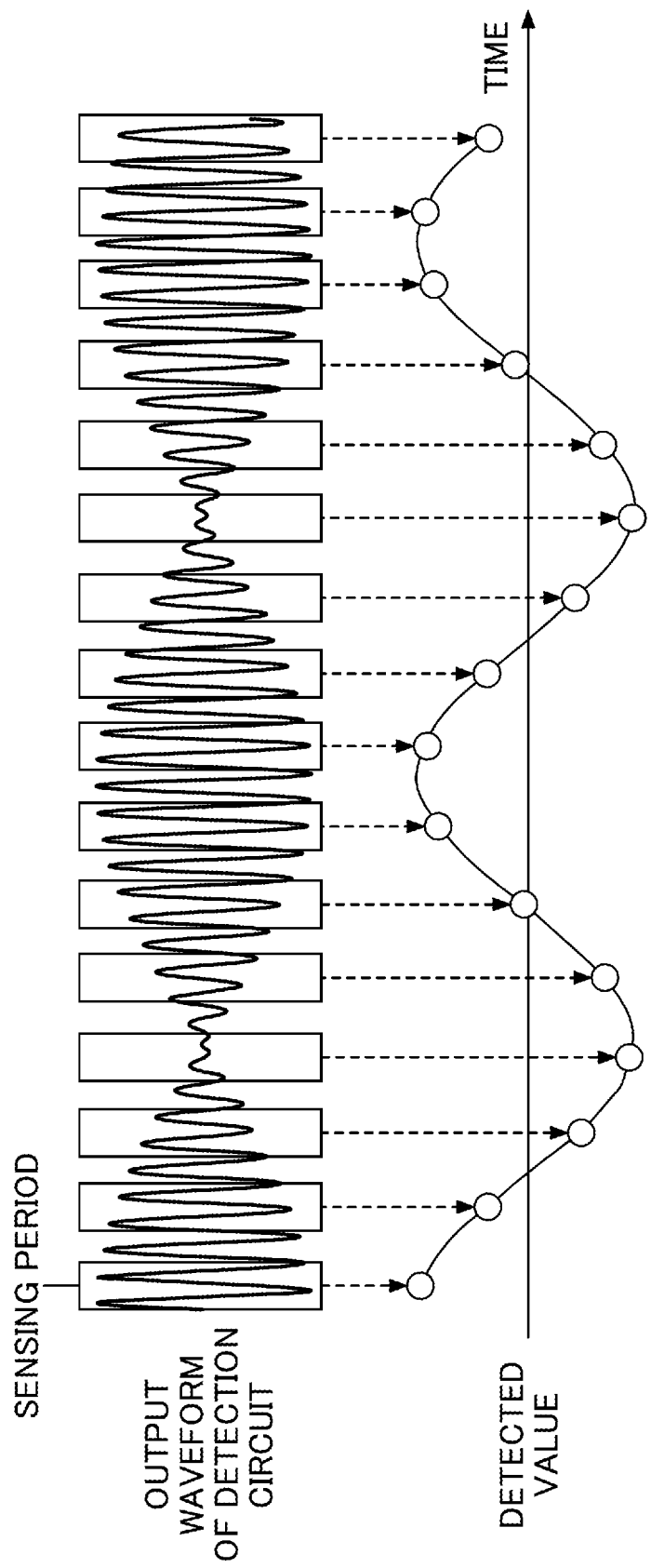
FIG. 7 is a drawing illustrating an example of detected values obtained from the synthesized wave illustrated in FIG. 6.

FIG. 7 is a drawing illustrating an example of detected values obtained from the synthesized wave illustrated in FIG. 6. The synthesized wave is obtained as an output waveform of the detection circuit 121. As illustrated in FIG. 7, the detected values obtained from the drive signal-noise synthesized wave change sinusoidally over time. In a case where a noise is occurring even when the operator is not performing an operation, the noise is picked up by the electrostatic sensor 110 and changes occur as the detected value change ΔAD, for example, as illustrated in FIG. 7. In a case where the detected value change ΔAD is a change at relatively large time intervals as illustrated, it may be erroneously detected that an operation has been performed.

It is good if, for example, the circuit unit 120 can internally distinguish a noise from the drive signal and remove the noise by, for example, a filter. However, when a noise having a frequency close to the drive frequency of the drive signal of the drive circuit 122 occurs, it is difficult to remove the noise.

Hence, for a case where a noise having a frequency close to the drive frequency of the drive signal occurs, the operation detection device 100 according to the embodiment is configured to be able to distinguish between a detected value based only on a human's operation and a synthesized wave containing the noise having the frequency close to the drive frequency of the drive signal, by making a detected value, which is obtained in a sensing period of a sensing cycle, change in a pattern that cannot occur in response to a human's operation.

Figure 8:
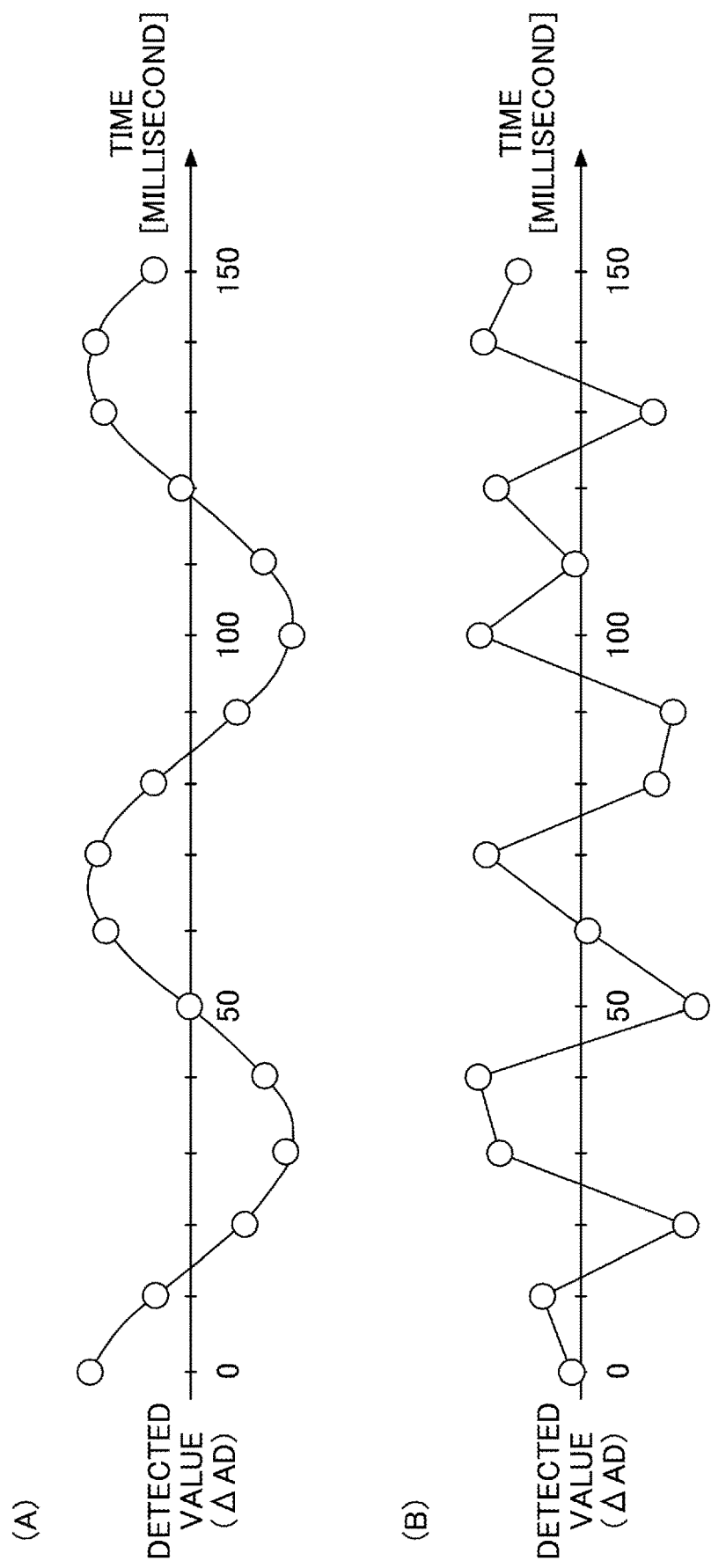
FIG. 8 is a drawing illustrating an example of a method for distinguishing the noise having the frequency close to the drive frequency of the drive signal.

FIG. 8 is a drawing illustrating an example of a method for distinguishing a noise having a frequency close to the drive frequency of the drive signal. (A) of FIG. 8 illustrates a waveform that is the same as the temporal change occurring as the detected value change ΔAD illustrated in FIG. 7. The temporal change occurring as the detected value change ΔAD illustrated in (A) of FIG. 8 is obtained when a noise having a frequency very close to the drive frequency of the drive signal occurs in a state in which the operator is not performing an operation.

When a noise having a frequency close to the drive frequency of the drive signal occurs, the operation detection device 100 according to the embodiment causes random changes as the detected value change ΔAD as illustrated in, for example, (B) of FIG. 8. In (B) of FIG. 8, the horizontal axis represents time (millisecond), and a random change occurs as the change ΔAD per 10 milliseconds.

A random change occurring as the change ΔAD per 10 milliseconds cannot be realized by a human's operation. A human can move his/her hand only a few times per second at the maximum, however quickly he/she moves the hand. Hence, the operation detection device 100 according to the embodiment distinguishes a change that occurs as the change ΔAD due to a noise from a change that occurs as the change ΔAD due to a human's operation, by determining whether a change is a change that can occur as the change ΔAD due to a human's operation.

Figure 9:
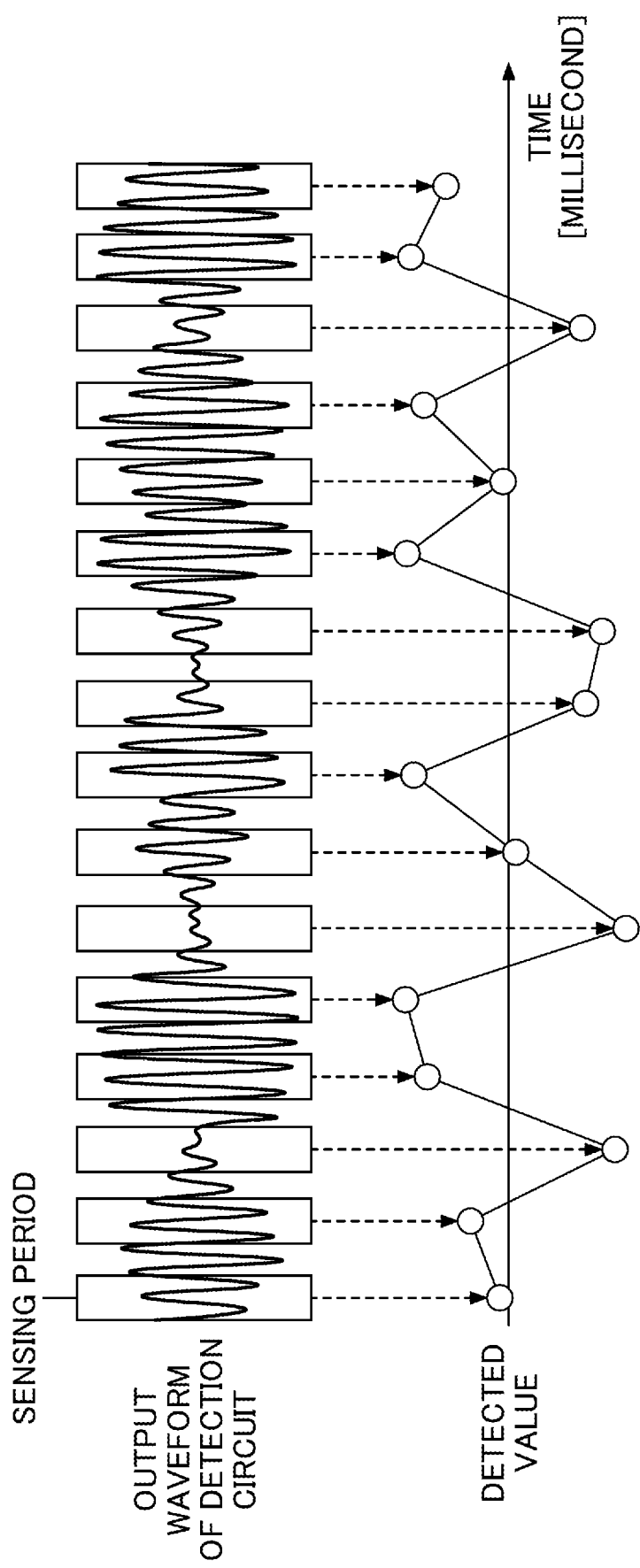
FIG. 9 is a drawing illustrating an example of detected values obtained from a drive signal-noise synthesized wave.

FIG. 9 is a drawing illustrating an example of detected values obtained from a drive signal-noise synthesized wave. A synthesized wave is obtained as an output waveform of the detection circuit 121. The detected values are the same as those in (B) of FIG. 8. When the detected values obtained from a drive signal-noise synthesized wave change over time in the fashion illustrated in FIG. 9, random changes occur as the detected value change ΔAD. Because changes occurring randomly as the change ΔAD at a cycle of some tens of milliseconds or shorter as illustrated cannot be realized by a human's operation, it is possible to distinguish such changes as changes occurring as the change ΔAD due to a noise.

Figure 10:
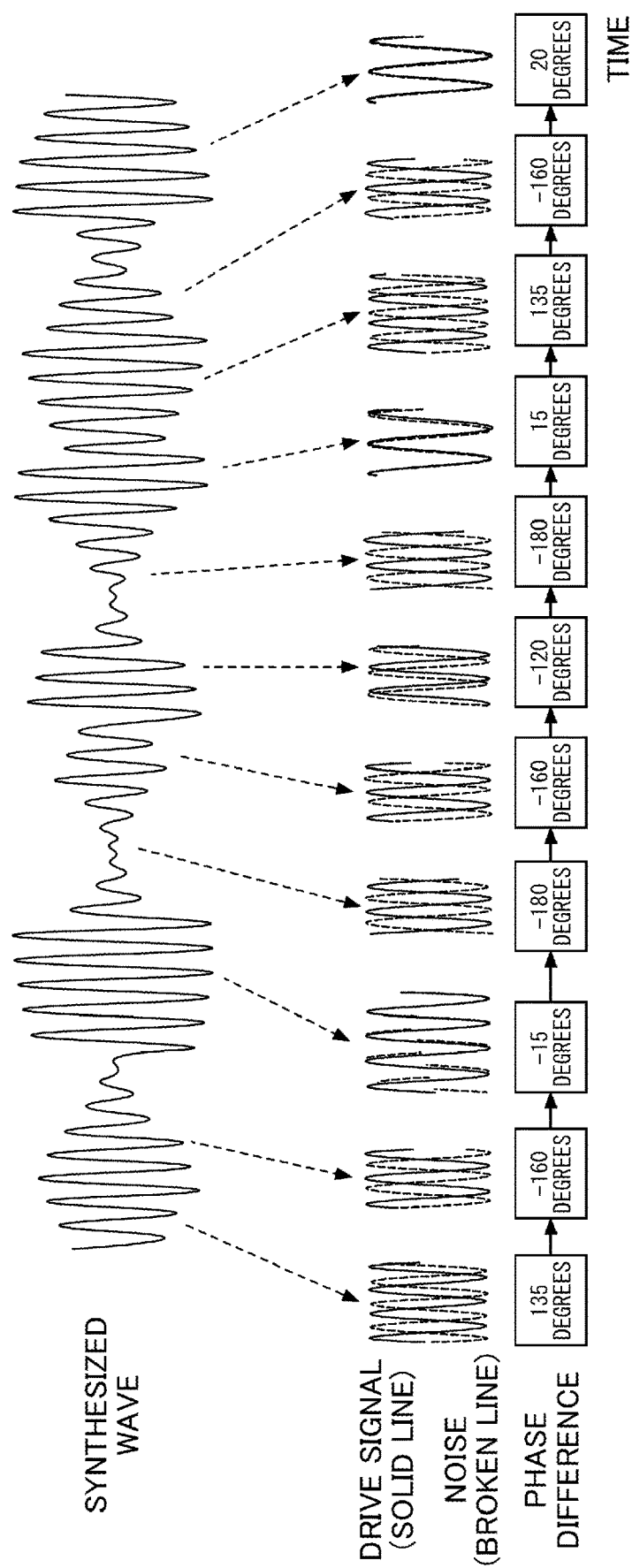
FIG. 10 is a drawing illustrating an example of a relationship between phase difference between a drive signal and a noise, and a synthesized wave.

FIG. 10 is a drawing illustrating an example of a relationship between the phase difference between the drive signal and a noise, and a synthesized wave. The synthesized wave illustrated in FIG. 10 is the same as the synthesized wave illustrated in FIG. 9. FIG. 10 illustrates the synthesized wave at the upper side, and illustrates waveforms of the drive signal and a noise, and phase differences at the lower side.

The phase difference of the noise with respect to the drive signal is, for example, 135 degrees, −160 degrees, −15 degrees, −180 degrees, −160 degrees, 120 degrees, −180 degrees, 15 degrees, 135 degrees, −160 degrees, and 20 degrees in the respective 10 millisecond periods of time. If it is possible to randomly shift the phase difference of the noise with respect to the drive signal in this way, it is possible to randomly vary the drive signal-noise synthesized wave from synthesizing period to synthesizing period, and to cause random changes as the change ΔAD.

Figure 11:
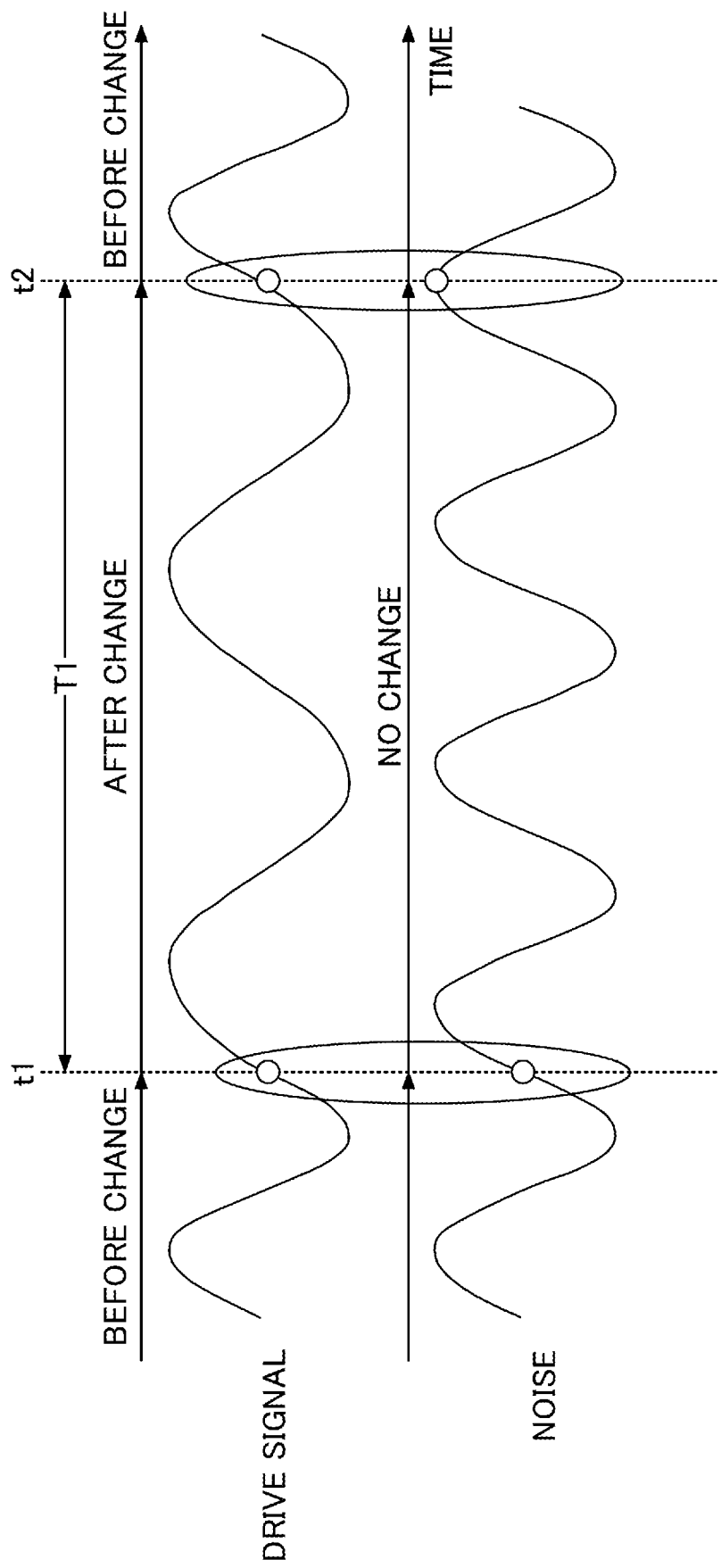
FIG. 11 is a drawing illustrating an example of a method for shifting a phase difference of a noise.

FIG. 11 is a drawing illustrating an example of a method for shifting the phase difference of a noise with respect to the drive signal. FIG. 11 illustrates an example of a waveform of the drive signal output by the circuit unit 120 of the operation detection device 100, and a waveform of a noise. Here, the drive frequency of the drive signal is temporarily changed by frequency hopping.

The drive frequency of the drive signal is temporarily changed to a different frequency by frequency hopping. Here, for facilitating understanding, it is assumed that the drive signal and the noise are at the same phase at a timing t1 immediately before performing frequency hopping. The drive frequency of the drive signal is changed to a different frequency by frequency hopping for a period of time T1 from the timing t1. The frequency of the noise does not change. The drive signal and the noise are at different phases at a timing t2 at which the period of time T1 ends. On and after the timing t2, the drive frequency of the drive signal is returned to the original frequency.

By controlling the drive circuit 122, it is possible to change the drive frequency of the drive signal in this way. Because the drive circuit 122 can change only the frequency without changing the amplitude, skewing tends not to occur, and effects due to worsening of radiation noise, which accompanies when a frequency is changed, are trivial. It is possible to change the frequency while maintaining the continuity of the waveform of the drive signal at the timings t1 and t2.

Because it is only necessary to hop the drive frequency of the drive signal to a frequency different from the drive frequency of the drive signal before performing frequency hopping and from the frequency of the noise, the same effect can be obtained at any frequency.

Figure 12:
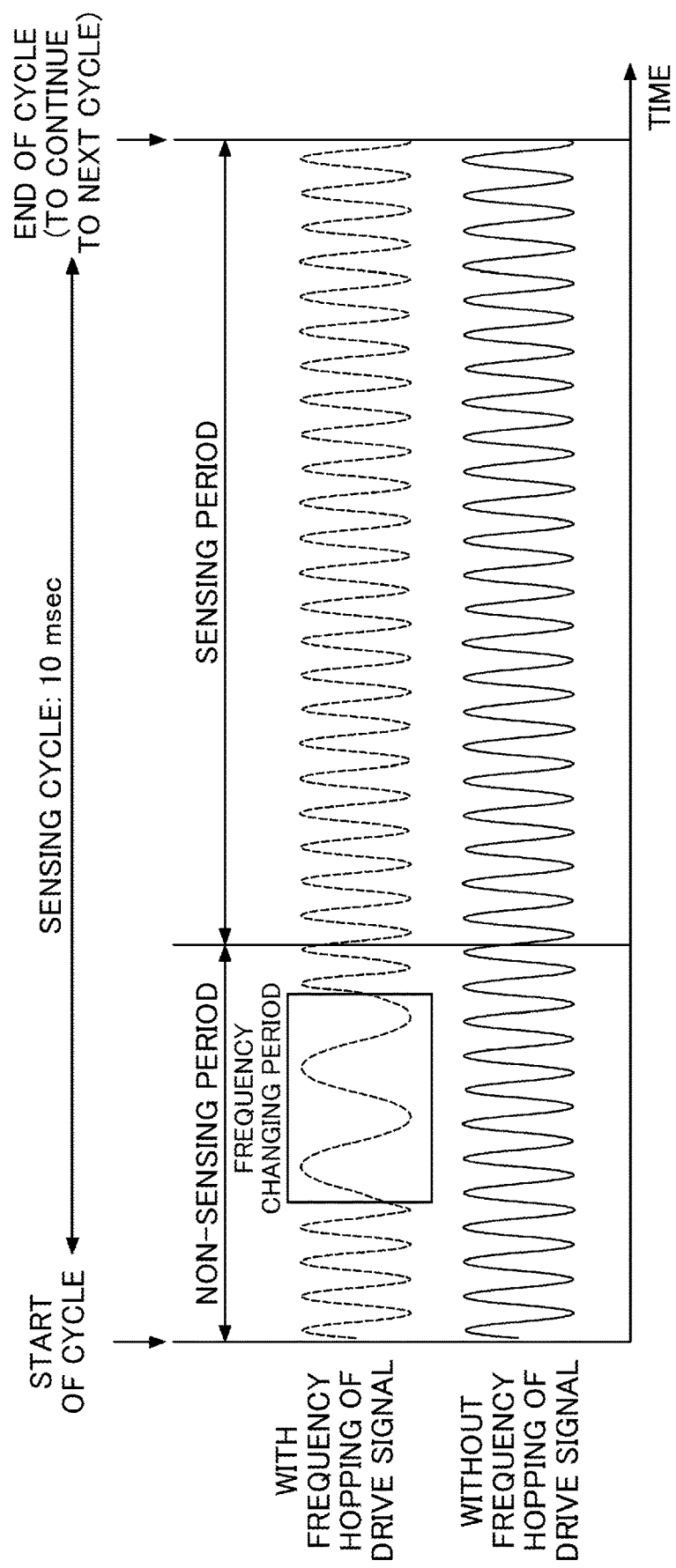
FIG. 12 is a drawing illustrating an example of a period (frequency changing period) in which frequency hopping is performed in a sensing cycle.

FIG. 12 is a drawing illustrating an example of a period (frequency changing period), in which frequency hopping is performed, in a sensing cycle. The control unit 130 converts an output from the detection circuit 121 from analog to digital and calculates a detected value change ΔAD in a sensing period of a sensing cycle. Hence, the point is to shift the phase difference between the drive signal and the noise in the sensing period. Since the sensing period is a period in which the change ΔAD is calculated, it is undesirable to perform frequency hopping in the sensing period.

Hence, as illustrated in FIG. 12, frequency hopping is performed in a non-sensing period. In this way, it is possible to shift the phase difference between the drive signal and the noise in the sensing period, and effects, which may occur due to changing the drive frequency, do not occur in the detected value change ΔAD because the waveform of the drive signal in the sensing period is not changed.

Based on this idea, for example, the operation detection device 100 performs frequency hopping in the non-sensing period of each sensing cycle and randomly changes the phase difference between the drive signal and the noise in the sensing period of each sensing cycle.

Hence, when a noise having a frequency close to the drive frequency of the drive signal occurs, it is possible to randomly change the phase difference between the drive signal and the noise as illustrated in FIG. 10, and to cause a quick and random detected value change ΔAD in a manner that cannot be realized by a human's operation.

By detecting such a detected value change ΔAD, it is possible to distinguish a change that occurs as the change ΔAD due to a noise from a change that occurs as the change ΔAD due to a human's operation.

The frequency changing period in which the frequency is changed by frequency hopping may be set in a non-sensing period as follows. The phase difference between the drive signal and the noise at the timing t1 immediately before performing frequency hopping in FIG. 11 may be adjusted in a range in which the phase difference can be shifted, within a range of from 0 degrees to 360 degrees.

In a case where there is some period of time between the timing at which the frequency changing period ends and the timing at which a sensing period starts, the phase difference between the drive signal and the noise at the timing at which the frequency changing period ends and the phase difference between the drive signal and the noise at the timing at which the sensing period starts are different in the strict sense of the term. However, the difference is an ignorable level, since the difference between the frequency of the drive signal and the frequency of the noise is minor.

FIG. 13 is a drawing illustrating an example of an effect resulting from randomly changing the phase difference between the drive signal and a noise by frequency hopping. (A) of FIG. 13 illustrates the detected value change ΔAD in a comparative case of not performing frequency hopping of the drive signal. The change ΔAD, expressed by a count value, is in the range of ±1500.

(B) of FIG. 13 illustrates the detected value change ΔAD in a case of performing frequency hopping of the drive signal. It can be seen that the change ΔAD is random and frequent. Because such a quick and random change cannot be realized by a human's operation, it can be determined that the change ΔAD is a change due to a noise. The change ΔAD, expressed by a count value, is in the range of ±1500.

As described above, by changing the drive frequency of the drive signal by frequency hopping in the non-sensing period, it is possible to randomly change the phase difference between the drive signal and the noise in the sensing period succeeding the non-sensing period at a pace of every some tens of millimeters or shorter. Such quick and random changes are a level that cannot be realized by a human's operation. When changes occur as the detected value change ΔAD in response to a human's operation, the number of times changes occur is a few times per second at the maximum, and changes occurring as the change ΔAD are not quick and random. Hence, based on changes occurring as the detected value change ΔAD, it is possible to detect changes occurring as the change ΔAD due to a noise and changes occurring as the change ΔAD due to a human's operation by distinguishing them from each other. As a result, when it is determined that that a change ΔAD due to a noise has occurred, it is possible to reduce the effects of the noise by changing (frequency-hopping) the drive frequency of the drive signal for the entirety of the period.

Hence, it is possible to provide an operation detection device 100 having a high detection accuracy based on reduced effects of a noise.

Because the control unit 130 changes the frequency of the drive waveform of the drive signal in a non-sensing period, it is possible to change the phase difference between the drive signal and a noise in a sensing period. Moreover, because frequency hopping for changing the frequency is performed in a non-sensing period, the frequency of the drive signal is constant in a sensing period. As the waveform of the drive signal is not changed in the sensing period, no effects occur in the detected value change ΔAD.

Because the control unit 130 randomly changes the frequency of the drive signal in a non-sensing period per sensing cycle, a random change occurs as the detected value change ΔAD and can be easily distinguished from a change that occurs as the detected value change ΔAD due to a human's operation. As a result, it is possible to provide an operation detection device 100 having an even higher detection accuracy based on reduced effects of a noise.

The control unit 130 changes the drive frequency of the drive signal in a non-sensing period such that a change that is to occur in a sensing period as the change ΔAD in the detected value generated based on an output value from the electrostatic sensor 110 in order to determine presence or absence of an operation is determinable as a change that is due to a noise. Therefore, a change occurring as the detected value change ΔAD due to a noise and a change occurring as the detected value change ΔAD due to a human's operation can be distinguished from each other reliably. As a result, it is possible to provide an operation detection device 100 having an even higher detection accuracy based on reduced effects of a noise.

Because a change that is a level that is determinable as a change occurring as the detected value change ΔAD due to a noise is a change occurring as the detected value change ΔAD at a speed that cannot be realized by a human's operation, a change occurring as the detected value change ΔAD due to a noise can be distinguished more reliably. As a result, it is possible to provide an operation detection device 100 having a very high detection accuracy based on reduced effects of a noise.

Because the control unit 130 adjusts the phase difference between the drive signal and a noise at a start point of a sensing period within a range of from 0 degrees through 360 degrees, it is possible to securely adjust the phase difference between the drive signal and a noise at a start point of a sensing period.

A condition (predetermined condition) for performing frequency hopping may be set to an output value from the electrostatic sensor 110. For example, in a case of very high-level intermittent noises occurring before a continuous noise occurs instead of a noise occurring constantly, frequency hopping may be performed when the control unit 130 detects that output values from the electrostatic sensor 110 indicate very high-level intermittent noises, to be ready for a sensing period. The phase difference between a noise and the drive signal can be adjusted when an output value from the electrostatic sensor 110 satisfies the predetermined condition for performing frequency hopping, and a change occurring as the detected value change ΔAD due to a noise and a change occurring as the detected value change ΔAD due to a human's operation can be distinguished from each other more efficiently and reliably.

An embodiment in which the drive signal is constantly applied to the electrostatic sensor 110 has been described above. Such an embodiment is a non-limiting embodiment. The drive signal may be applied to the electrostatic sensor 110, for example, intermittently.

Figure 14:
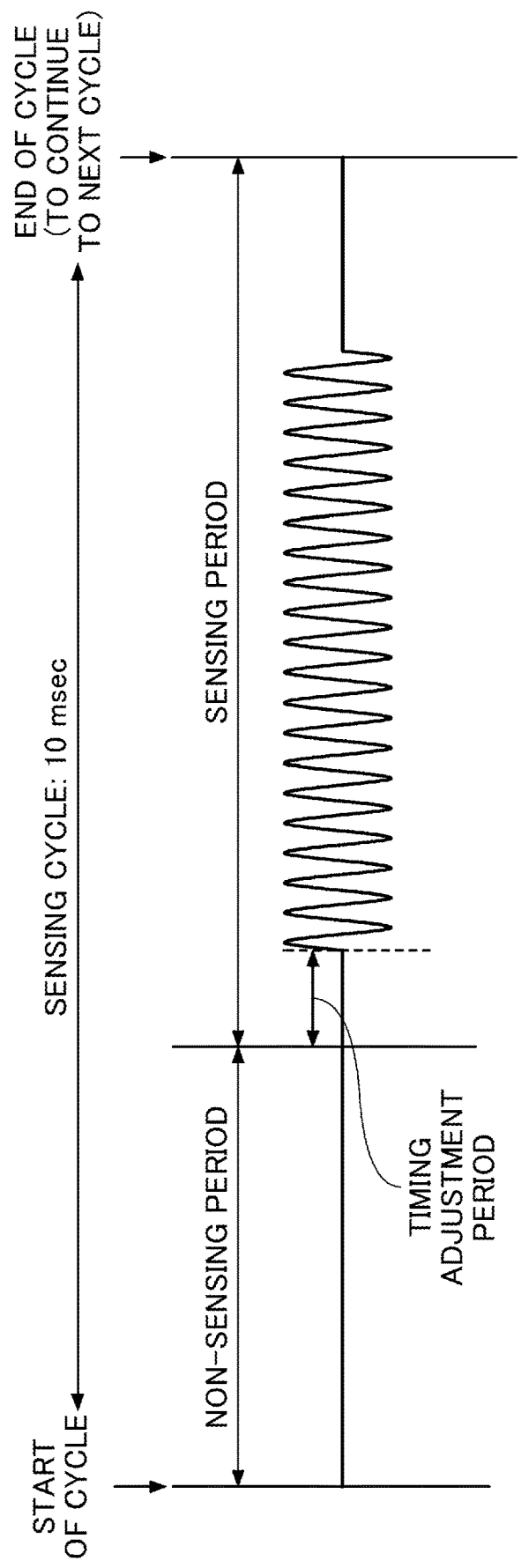
FIG. 14 is a drawing illustrating an example of a method for adjusting a phase difference according to a modified example.

An embodiment in which frequency hopping is performed in a non-sensing period to adjust the phase difference between the drive signal and a noise in a sensing period has been described above. However, the phase difference may be adjusted as illustrated in FIG. 14. FIG. 14 is a drawing illustrating an example of a method for adjusting the phase difference according to a modified example.

In FIG. 14, the sensing cycle is, for example, 10 milliseconds, a non-sensing period is a predetermined period from a start of a cycle, and a sensing period is a remaining period after the non-sensing period ends. Here, the drive signal is driven only in a sensing period.

The drive signal starts to be driven after a non-sensing period switches to a sensing period. The phase difference between a noise and the drive signal may be adjusted in a timing adjustment period that is provided at the beginning of a sensing period in order that the timing at which the drive signal starts to be driven can be adjusted. For example, by varying the length of the timing adjustment period per sensing cycle, it is possible to cause quick and random changes as the detected value change ΔAD as soon as a noise is detected. Hence, a change occurring as a detected value change ΔAD due to a noise and a change occurring as a detected value change ΔAD due to a human's operation can be distinguished from each other reliably. As a result, it is possible to provide an operation detection device 100 having a high detection accuracy based on reduced effects of a noise.

The operation detection device according to an illustrative embodiment of the present invention has been described above. However, the present invention is not limited to the specifically disclosed embodiment, and various modifications and changes are applicable without departing from the scope of the claims.

What is claimed is:

1. An operation detection device, comprising:
   an electrostatic sensor;
   a drive circuit configured to output a drive signal to the electrostatic sensor in order to detect an operator's operation on the electrostatic sensor; and
   a control unit configured to determine presence or absence of the operation based on an output value of the electrostatic sensor, and control a drive waveform of the drive signal,
   wherein the control unit controls the drive waveform according to a cycle that is a predetermined period of time including both a detection period in which detection of the operation is performed and a non-detection period in which detection of the operation is not performed,
   the drive waveform has a shape that is based on a periodic function that repeats a constant pattern for an entirety of the cycle, and
   the control unit changes a phase of the drive signal in the detection period by controlling a property of the drive waveform in the non-detection period.

2. The operation detection device according to claim 1, wherein the control unit changes a frequency of the drive signal in the non-detection period, as the controlling of the property.

3. The operation detection device according to claim 2, wherein the control unit randomly changes the frequency of the drive signal in the non-detection period per the cycle.

4. The operation detection device according to claim 2, wherein the control unit changes the frequency of the drive signal in the non-detection period such that a change that is to occur in the detection period in a detected value generated based on the output value of the electrostatic sensor in order to determine presence or absence of the operation, becomes a change of a level determinable as a change that is due to a noise.

5. The operation detection device according to claim 4, wherein the change of the level determinable as the change that is due to the noise is a change in the detected value at a speed that is unrealizable by a human's operation.

6. The operation detection device according to claim 2, wherein the control unit changes the frequency of the drive signal in the non-detection period when the output value of the electrostatic sensor satisfies a predetermined condition.

7. The operation detection device according to claim 6, wherein the control unit adjusts a period in which the control unit changes the frequency of the drive signal in the non-detection period, in order to set a phase difference between the drive signal and a noise at a start point of the detection period within a range of from 0 degrees through 360 degrees.

* * * * *